(12) United States Patent
Udaka et al.

(10) Patent No.: US 8,218,333 B2
(45) Date of Patent: Jul. 10, 2012

(54) PRINTED CIRCUIT BOARD AND MOUNTING STRUCTURE FOR SURFACE MOUNTED DEVICE

(75) Inventors: Masato Udaka, Hyogo (JP); Seiji Tokii, Hyogo (JP)

(73) Assignee: Panasonic Corporation, Osaka (JP)

( * ) Notice: Subject to any disclaimer, the term of this patent is extended or adjusted under 35 U.S.C. 154(b) by 386 days.

(21) Appl. No.: 12/401,247

(22) Filed: Mar. 10, 2009

(65) Prior Publication Data

US 2009/0229879 A1    Sep. 17, 2009

(30) Foreign Application Priority Data

Mar. 11, 2008    (JP) ................... 2008-061638

(51) Int. Cl.
*H05K 1/18*    (2006.01)
(52) U.S. Cl. ......... 361/767; 174/261; 257/787; 438/125
(58) Field of Classification Search .................. 438/616, 438/125; 174/261, 257, 260, 250, 255; 257/686, 257/692, 773, 666, 787, 788; 361/679.01, 361/679.02, 767, 816, 783, 760, 813, 709, 361/712
See application file for complete search history.

(56) References Cited

U.S. PATENT DOCUMENTS

| | | | | |
|---|---|---|---|---|
| 6,580,036 B2* | 6/2003 | Kim et al. | | 174/261 |
| 6,653,219 B2* | 11/2003 | Fukuyama | | 438/616 |
| 2005/0092709 A1* | 5/2005 | Chun et al. | | 216/13 |
| 2008/0136004 A1* | 6/2008 | Yang et al. | | 257/686 |
| 2011/0176284 A1* | 7/2011 | Ito et al. | | 361/762 |

FOREIGN PATENT DOCUMENTS

| | | |
|---|---|---|
| GB | 2 247 113 | 2/1992 |
| JP | 4-99394 | 3/1992 |
| JP | 2000-174410 | 6/2000 |
| JP | 2004-055660 | 2/2004 |

* cited by examiner

*Primary Examiner* — Hung Duong
(74) *Attorney, Agent, or Firm* — Hamre, Schumann, Mueller & Larson, P.C.

(57) ABSTRACT

The present invention provides a printed circuit board capable of sufficiently ensuring joint strength and joint reliability when mounting a surface mounted device, and a mounting structure for a surface mounted device using the printed circuit board. A BGA package as a surface mounted device includes a plurality of solder balls arranged thereon and a printed circuit board includes a plurality of mounting pads corresponding respectively to the plurality of solder balls. The BGA package is connected to the mounting pads on the printed circuit board due to melting of the solder balls, thereby mounted on the printed circuit board. A concave via hole is formed on each of the mounting pads having a circular surface shape and a part of the solder ball is in the convex via hole. Here, the center of the convex via hole is apart from the center of each of the mounting pads by at least the diameter of the concave via hole.

12 Claims, 6 Drawing Sheets

PRINTED CIRCUIT BOARD AND MOUNTING STRUCTURE FOR SURFACE MOUNTED DEVICE

FIELD OF THE INVENTION

The present invention relates to a printed circuit board preferable for mounting a surface mounted device, such as a ball grid array (BGA) package including a plurality of solder balls arranged thereon, and a mounting structure for a surface mounted device using the printed circuit board.

DESCRIPTION OF RELATED ART

In recent years, remarkable progress has been made in mounting components on printed circuit boards with high density. Interstitial via holes (IVHs) (hereinafter simply referred to as "via holes") have been used heavily for multi-layer boards, and the need for providing via holes on mounting pads on which surface mounted devices are soldered has arisen (see Patent documents 1 and 2, for example).

First, a conventional mounting structure for a surface mounted device will be described with reference to FIG. 6. FIG. 6 is a cross-sectional view partially showing a conventional mounting structure for a surface mounted device.

In FIG. 6, reference numeral 17 denotes a BGA package as a surface mounted device. The BGA package 17 includes a plurality of solder balls 17a arranged thereon. Further, reference numeral 18 denotes a printed circuit board. The printed circuit board 18 includes a plurality of mounting pads 19, each of which corresponds to each of the plurality of solder balls 17a. Here, a concave via hole 20 is provided on each of the mounting pads 19 at the center. In FIG. 6, reference numerals 21 and 22 denote insulating boards, 23 and 24 denote wirings, and 25 denotes a via hole. The BGA package 17 is connected to the mounting pads 19 due to melting of the solder balls 17a, and thereby mounted on the printed circuit board 18.

Next, a method of manufacturing the conventional mounting structure for a surface mounted device will be described with reference to FIG. 7. FIGS. 7A-D include cross-sectional views showing steps in the method of manufacturing the conventional mounting structure for a surface mounted device.

As shown in FIG. 7A, in the conventional printed circuit board 18, the concave via hole 20 is provided on the mounting pad 19 at the center.

First, as shown in FIG. 7B, cream solder 26 is applied on the mounting pad 19 using screen printing.

Next, as shown in FIG. 7C, the BGA package 17 is placed on the cream solder 26 via the solder ball 17a.

Finally, as shown in FIGS. 7C and 7D, the printed circuit board 18 is heated using a heating reflow process until the temperature reaches the point at which the cream solder 26 melts. As a result, the BGA package 17 is connected to the mounting pad 19 on the printed circuit board 18 due to the melting of the solder balls 17a and the cream solder 26, and thereby mounted on the printed circuit board 18.

Patent document 1: JP H4-99394 A
Patent document 2: JP 2000-174410 A

When printing the cream solder 26 on the mounting pad 19 in the step shown in FIG. 7B, however, the concave via hole 20 does not become filled with the cream solder 26 completely, and air remains therein. Thus, with a conventional printed circuit board in which the concave via hole 20 is provided on each of the mounting pads 19 at the center, the concave via hole 20 is blocked by the solder ball 17a of the BGA package 17 when placing the BGA package 17 on the cream solder 26 in the step shown in FIG. 7C. That is, the air is trapped in the concave via hole 20. If heating is performed until the temperature reaches to a point at which the cream solder 26 melts in a state where the air is trapped in the concave via hole 20 (see FIGS. 7C and 7D), the air in the concave via hole 20 expands in a state where the solder ball 17a is melted. Since the air is pressed uniformly at its periphery by the molten solder ball 17, it cannot escape from the solder ball 17a. The soldering (mounting of the BGA package 17 on the printed circuit board 18) ends while the air is still trapped in the concave via hole 20. Since this air (void) 27 is connected to the concave via hole 20 as a source of voids, it affects the joint strength and the joint reliability between the BGA package 17 and the printed circuit board 18.

SUMMARY OF THE INVENTION

Therefore, with the foregoing in mind, it is an object of the present invention to provide a printed circuit board capable of sufficiently ensuring joint strength and joint reliability when mounting a surface mounted device thereon, and a mounting structure for a surface mounted device using the printed circuit board.

In order to achieve the above object, the printed circuit board of the present invention includes a plurality of mounting pads each provided with a concave via hole. The center of the concave via hole on each of the mounting pads is apart from the center of each of the mounting pads by at least the diameter of the concave via hole. Here, the center of the mounting pad refers to the centroid of the surface shape thereof.

According to the configuration of the printed circuit board of the present invention, the following effect can be obtained. That is, it may be possible to prevent the solder balls of the surface mounted device from blocking the concave via holes by providing each of the concave via holes at a position that the center of the concave via hole is apart from the center of the mounting pad by at least the radius of the concave via hole. However, by providing each of the concave via holes at a position that the center of the concave via hole is apart from the center of the mounting pad by at least the diameter of the concave via hole, it is possible to prevent with more certainty the solder balls of the surface mounted device from blocking the concave via holes when placing the surface mounted device on cream solder on the mounting pads. The concave via holes are not blocked by the solder balls when the surface mounted device is placed on the cream solder. Thus, also in a step of melting the cream solder, air in the concave via holes can escape through particles of the cream solder until the temperature reaches a point at which the cream solder melts. At the temperature at which the solder balls of the surface mounted device melt, a part of the molten solder close to the concave via hole has a small thickness and is pressed by the part of the molten solder on the side opposite to the direction in which the concave via hole is shifted. Thus, the air can escape from the solder ball easily. As a result, the concave via hole is filled with the solder and voids become less likely to remain in the solder joints. Therefore, it is possible to achieve the mounting structure for a surface mounted device in which the joint strength and the joint reliability between the surface mounted device and the printed circuit board are ensured sufficiently.

The mounting structure for a surface mounted device of the present invention includes: a printed circuit board including a plurality of mounting pads each provided with a concave via hole; and a surface mounted device including a plurality of solder balls arranged thereon. The plurality of solder balls correspond respectively to the plurality of mounting pads, and the surface mounted device is mounted on the printed circuit board via the solder balls. The center of the concave via hole on each of the mounting pads is apart from the center of each of the mounting pads by at least the diameter of the concave via hole.

In the printed circuit board or the mounting structure for a surface mounted device of the present invention, it is preferable that the surface shape of the mounting pad is selected from a group consisting of circular, elliptic, and rectangular shapes. In this case, it is preferable that the surface shape of the mounting pad is circular, and the concave via hole is provided in the vicinity of the circumference of the mounting pad. Further, in this case, it is preferable that the surface shape of the mounting pad is elliptic, and the concave via hole is provided in the vicinity of an end of the major axis of the mounting pad. Further, in this case, it is preferable that the surface shape of the mounting pad is rectangular, and the concave via hole is provided in the vicinity of a corner portion of the mounting pad. According to these preferred examples, the above effect can be easily produced.

In the mounting structure for a surface mounted device of the present invention, it is preferable that the surface mounted device is a BGA package.

The method of mounting a surface mounted device of the present invention includes: disposing each of solder balls arranged on a surface mounted device on each of the mounting pads on the above printed circuit board at the center; and solder-jointing the mounting pads and the surface mounted device. By disposing the solder ball on the mounting pad at the center, it is possible to ensure the connection between the mounting pad and a terminal electrode of the surface mounted device and to prevent the solder balls from blocking the concave via holes on the mounting pads as described above. Thus, it is possible to achieve reliable solder-jointing.

According to the present invention, it is possible to ensure the joint strength and the joint reliability between the printed circuit board and a surface mounted device when mounting the surface mounted device.

BRIEF DESCRIPTION OF THE DRAWINGS

FIG. 5A is a plan view of an elliptic mounting pad and FIG. 5B is a plan view of a rectangular mounting pad.

DETAILED DESCRIPTION OF THE INVENTION

Hereinafter, the present invention will be described in detail by way of illustrative embodiments with reference to the drawings.

A Mounting Structure for a Surface Mounted Device

Figure 1:
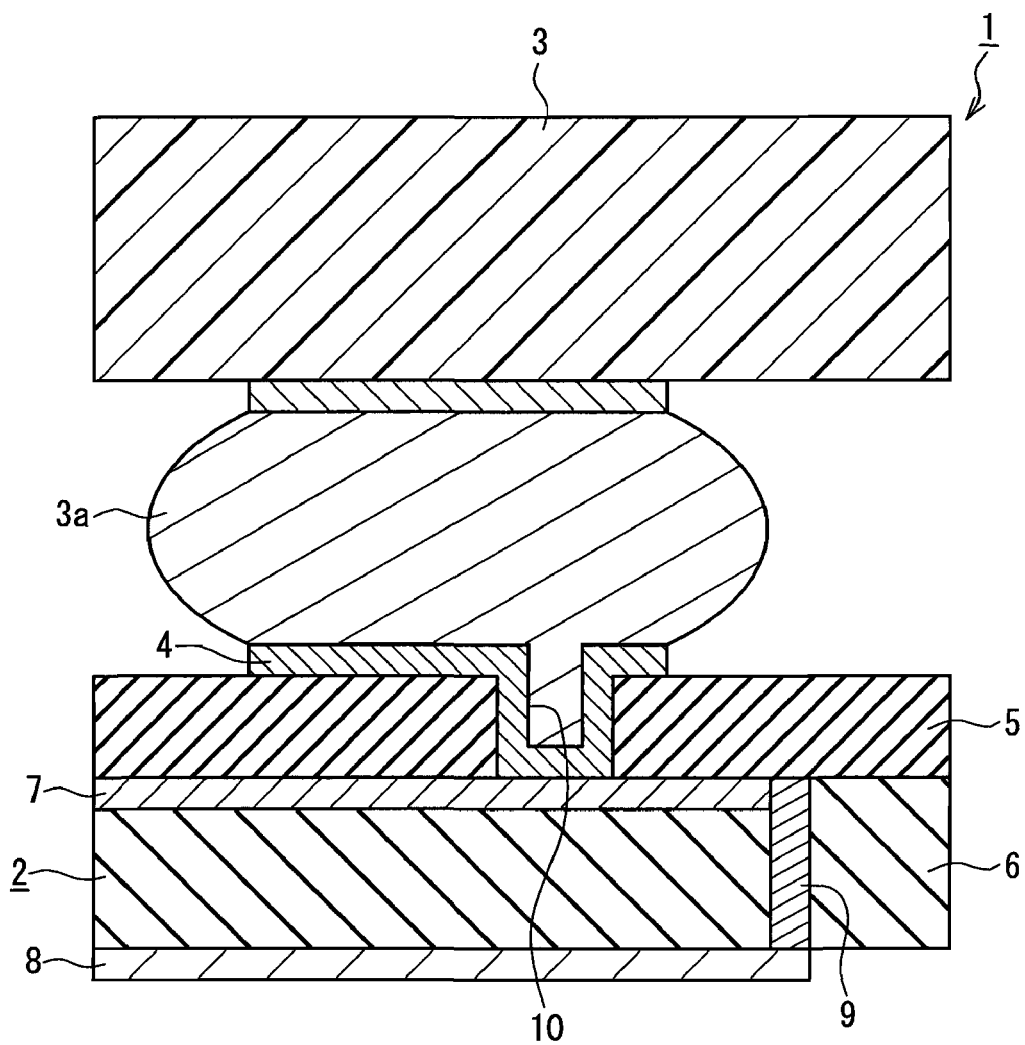
FIG. 1 is a cross-sectional view partially showing a mounting structure for a surface mounted device according to one embodiment of the present invention.
Figure 2:
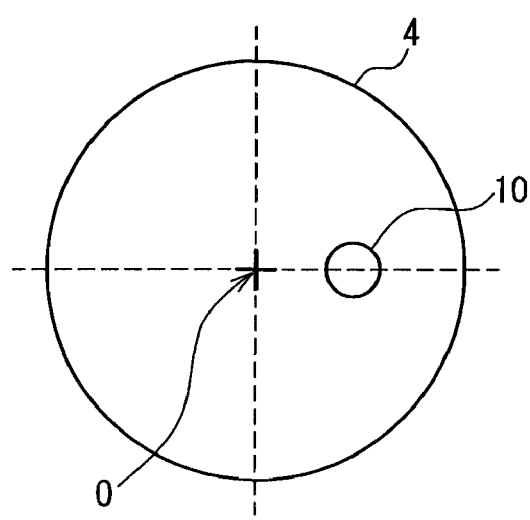
FIG. 2 is a plan view showing a mounting pad used in the mounting structure for a surface mounted device according to one embodiment of the present invention.
Figure 3:
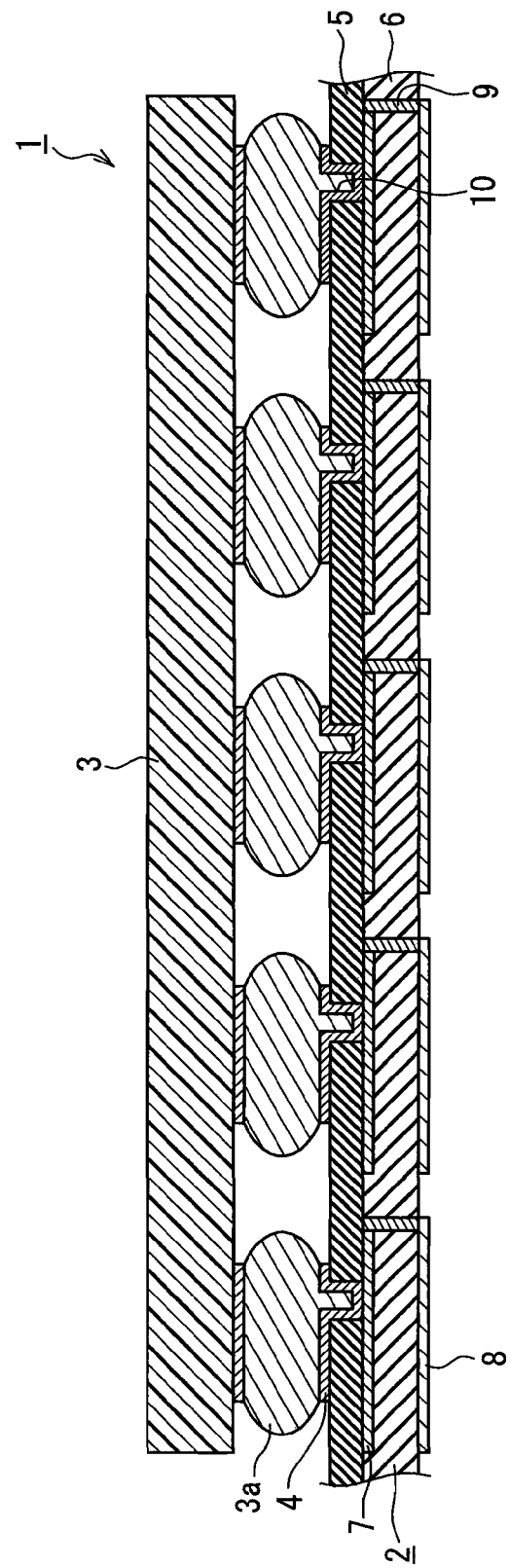
FIG. 3 is a cross-sectional view showing the entire configuration of the mounting structure for a surface mounted device according to one embodiment of the present invention.

First, a mounting structure for a surface mounted device according to one embodiment of the present invention will be described. FIG. 1 is a cross-sectional view partially showing the mounting structure for a surface mounted device according to one embodiment of the present invention. FIG. 2 is a plan view of a mounting pad used in the mounting structure for a surface mounted device according to one embodiment of the present invention. FIG. 3 is a cross-sectional view showing the entire configuration of the mounting structure for a surface mounted device according to one embodiment of the present invention.

As shown in FIGS. 1 and 3, a mounting structure 1 for a surface mounted device (hereinafter simply referred to as "the mounting structure 1") according to the present embodiment includes a printed circuit board 2 and a BGA package 3 as a surface mounted device mounted on the printed circuit board 2.

The BGA package 3 includes a plurality of solder balls 3a that are arranged thereon. Further, the printed circuit board 2 includes a plurality of mounting pads 4, each of which corresponds to one of the plurality of solder balls 3a. The BGA package 3 is connected to the mounting pads 4 on the printed circuit board 2 due to melting of the solder balls 3a, thereby mounted on the printed circuit board 2.

In the mounting structure 1 according to the present embodiment, a multilayer board is used as the printed circuit board 2. In FIGS. 1 and 3, reference numerals 5 and 6 denote insulating boards, 7 and 8 denote wirings, and 9 denotes a via hole.

As shown in FIGS. 1 and 2, the mounting pads 4 have a circular surface shape. The concave via hole 10 is formed on each of the mounting pads 4. Apart of the solder ball 3a is in the concave via hole 10. Here, the center of the concave via hole 10 is apart from the center O of the mounting pad 4 by at least the diameter of the via hole 10. As a specific numerical example, when the diameter of the mounting pad 4 is 400 μm and the diameter of the concave via hole 10 is 100 μm, the center of the concave via hole 10 is apart from the center O of the mounting pad 4 by 100 μm or more. Preferably, the concave via hole 10 is provided in the vicinity of the circumference of the mounting pad 4. "The vicinity of the circumference" refers to a position that the distance between an arbitrary point on the circumference and the center of the concave via hole 10 is within the diameter of the concave via hole 10.

Further, by disposing the solder balls 3a on the mounting pads 4 at the center and soldering the BGA package 3, the molten solder balls 3a do not block the concave via holes 10, and the BGA package 3 can be mounted by solder on the printed circuit board 2 with certainty.

A Method of Manufacturing the Mounting Structure for a Surface Mounted Device

Next, a method of manufacturing the mounting structure for a surface mounted device according to the present embodiment will be described.

FIGS. 4A-D include cross-sectional views showing steps in the method of manufacturing the mounting structure for a surface mounted device according to one embodiment of the present invention.

Figure 4A:
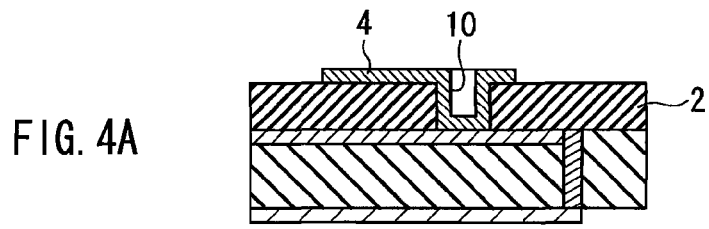
FIGS. 4A-D include cross-sectional views showing steps in a method of manufacturing the mounting structure for a surface mounted device according to one embodiment of the present invention.

As shown in FIG. 4A, in the printed circuit board 2 according to the present embodiment, the concave via hole 10 is provided at a position that the center of the concave via hole 10 and the center O of the mounting pad 4 are apart from each other by at least the diameter of the concave via hole 10.

Figure 4B:
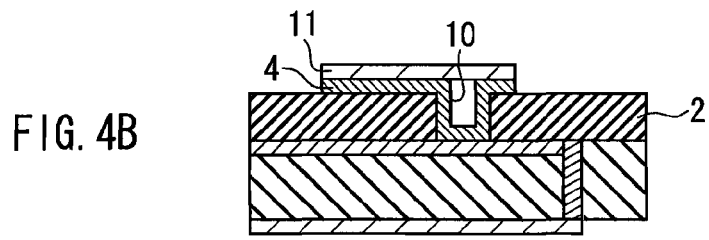

First, as shown in FIG. 4B, cream solder 11 is applied onto the mounting pad 4 using screen printing.

Figure 4C:
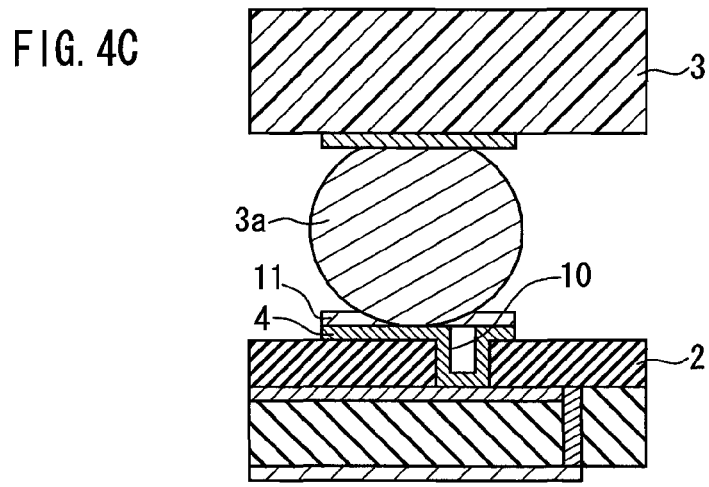

Then, as shown in FIG. 4C, the BGA package 3 as a surface mounted device is placed on the cream solder 11 via the solder ball 3a.

Figure 4D:
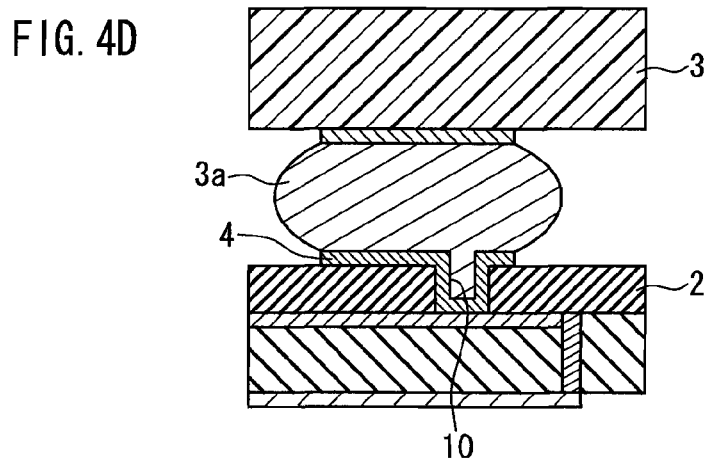

Finally, as shown in FIGS. 4C and 4D, the printed circuit board 2 is heated using a heating reflow process until the temperature reaches a point at which the cream solder 11 melts. Thereby, the BGA package 3 is connected to the mounting pad 4 on the printed circuit board 2 due to melting of the solder ball 3a and the cream solder 11, thereby mounted on the printed circuit board 2.

Effects

Hereinafter, effects obtained by providing the concave via hole 10 at a position that the center of the concave via hole 10 and the center O of the mounting pad 4 are apart from each other by at least the diameter of the concave via hole 10 will be described.

Similarly to the conventional method, when printing the cream solder 11 on the mounting pad 4 in the step shown in FIG. 4B, the concave via holes 10 do not become filled with the cream solder 11 completely, and thereby air remains therein.

However, in the present embodiment, the concave via hole 10 is provided at a position that the center of the concave via hole 10 and the center O of the mounting pad 4 are apart from each other by at least the diameter of the concave via hole 10. Thus, when placing the BGA package 3 on the cream solder 11 in the step shown in FIG. 4C, the concave via hole 10 is not blocked by the solder ball 3a of the BGA package 3. As just described, the concave via hole 10 is not blocked by the solder ball 3a when the BGA package 3 is placed on the cream solder 11. Therefore, also in the step of melting the cream solder 11 shown in FIGS. 4C and 4D, the air in the concave via holes 10 can escape through particles of the cream solder 11 until the temperature reaches a point at which the cream solder 11 melts. At the temperature at which the solder balls 3a of the BGA package 3 melt, a part of the molten solder close to the concave via hole 10 has a small thickness and is pressed by a part of the molten solder on the side opposite to the direction in which the concave via hole 10 is shifted. Thus, the air can escape from the solder ball 3a easily. As a result, the concave via hole 10 is filled with the solder and voids become less likely to remain in the solder joint. Therefore, it is possible to achieve the mounting structure 1 in which the joint strength and the joint reliability between the BGA package 3 and the printed circuit board 2 are ensured sufficiently. In order to produce the above effect easily, it is preferable that the concave via hole 10 is provided in the vicinity of the circumference of each of the mounting pad 4 as described above.

Though the present embodiment refers to an example of using the mounting pads 4 having a circular surface shape, the surface shape of the mounting pad is not limited to circular. For example, as shown in FIG. 5, a mounting pad having a surface shape such as elliptic or rectangular can be used.

Figure 5A:
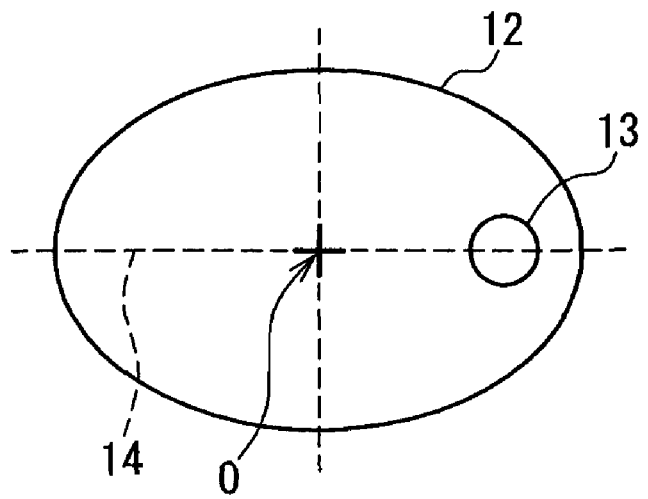
FIGS. 5A-B include plan views showing other examples of the mounting pad used in the mounting structure for a surface mounted device according to one embodiment of the present invention.

When using mounting pads 12 having an elliptic surface shape as shown in FIG. 5A, it is preferable that the concave via hole 13 is provided in the vicinity of an end of the major axis 14 of the mounting pad 12 so as to produce the above effect easily. As a specific numerical example, when the major axis of the mounting pad 12 is 400 μm, the minor axis of the mounting pad 12 is 300 μm, and the diameter of the concave via hole 13 is 100 μm, the center of the concave via hole 13 is apart from the center O of the mounting pad 12 by 100 μm or more. "The vicinity of an end of the major axis" refers to a position that the distance between an end of the major axis and the center of the concave via hole 13 is within the diameter of the concave via hole 13.

Figure 5B:
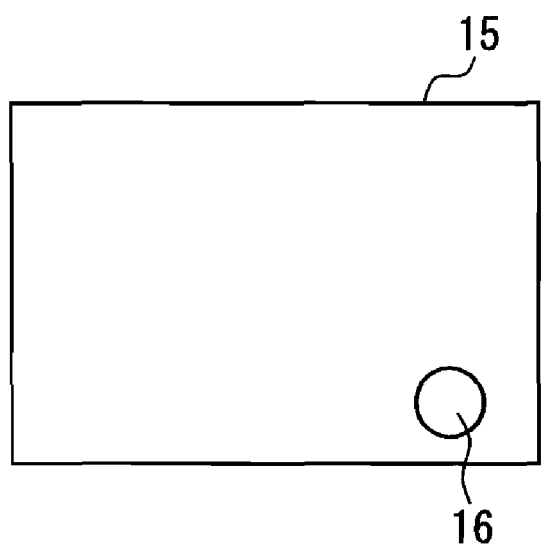
Figure 6:
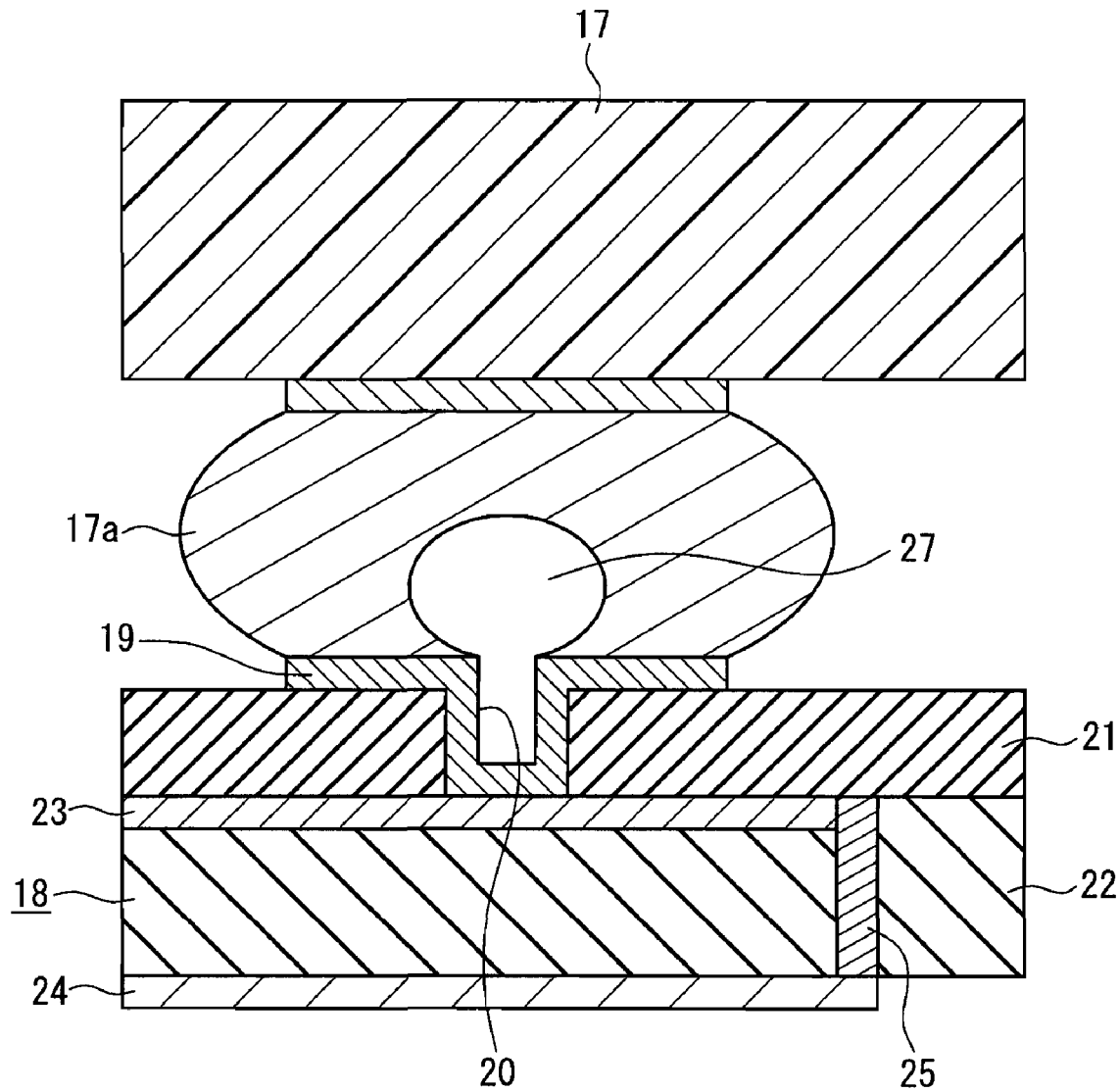
FIG. 6 is a cross-sectional view partially showing a conventional mounting structure for a surface mounted device.
Figure 7A:
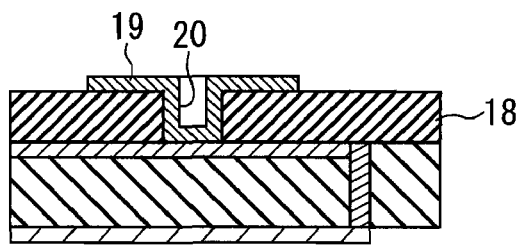
FIGS. 7A-D include cross-sectional views showing steps in a method of manufacturing the conventional mounting structure for a surface mounted device.
Figure 7B:
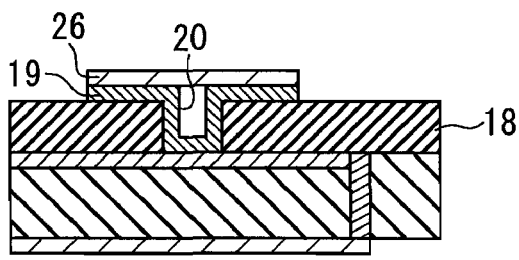
Figure 7C:
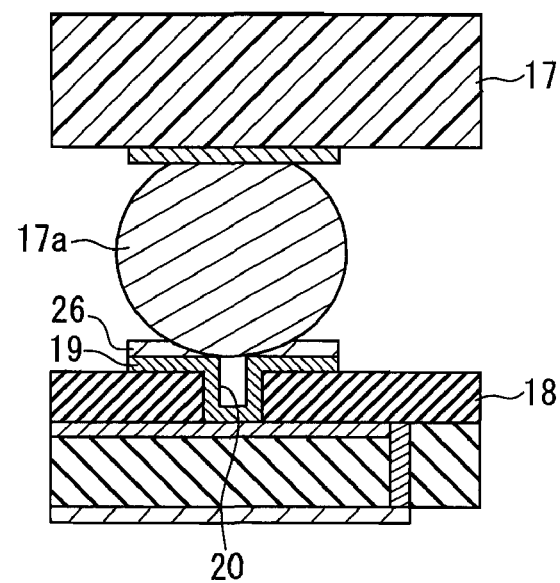
Figure 7D:
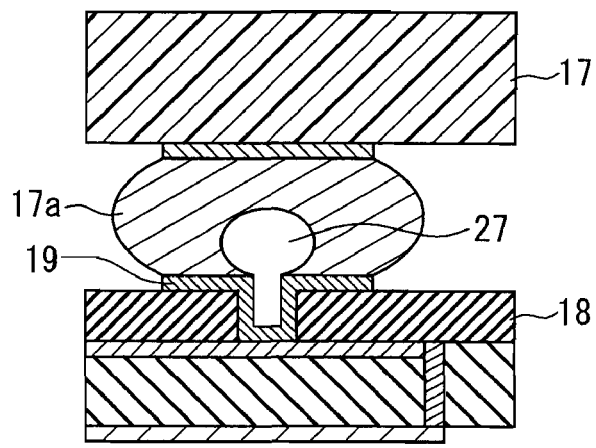

When using mounting pads 15 having a rectangular surface shape as shown in FIG. 5B, it is preferable that a concave via hole 16 is provided in the vicinity of a corner portion of the mounting pad 15 so as to produce the above effect easily. As a specific numerical example, when the longer side of the mounting pad 15 is 400 μm, the shorter side of the mounting pad 15 is 300 μm, and the diameter of the concave via hole 16 is 100 μm, the center of the concave via hole 16 is apart from the center of the mounting pad 15 by 100 μm or more. "The vicinity of a corner portion" refers to a position that the distance between the corner portion and the center of the concave via hole 16 is within the diameter of the concave via hole 16.

Though the present embodiment refers to an example of using the BGA package 3 as the surface mounted device, the surface mounted device is not limited to a BGA package. The present invention can be used as a mounting structure for a land grid array (LGA) package or the like.

As described above, according to the present invention, the joint strength and the joint reliability between a printed circuit board and a surface mounted device can be ensured sufficiently when mounting the surface mounted device. Thus, the present invention is useful as a mounting structure for a surface mounted device incorporated in a mobile device such as a mobile phone to which a demand for robustness against a drop impact or the like have been increasing.

The invention may be embodied in other forms without departing from the spirit of essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A printed circuit board comprising a plurality of mounting pads each having a concave via hole with a void,
    wherein the center of the concave via hole on each of the mounting pads is apart from the center of each of the mounting pads by at least the diameter of the concave via hole.

2. The printed circuit board according to claim 1, wherein a surface shape of the mounting pad is selected from a group consisting of circular, elliptic, and rectangular shapes.

3. The printed circuit board according to claim 2, wherein the surface shape of the mounting pad is circular, and the concave via hole is provided in the vicinity of the circumference of the mounting pad.

4. The printed circuit board according to claim 2, wherein the surface shape of the mounting pad is elliptic, and the concave via hole is provided in the vicinity of an end of the major axis of the mounting pad.

5. The printed circuit board according to claim 2, wherein the surface shape of the mounting pad is rectangular, and the concave via hole is provided in the vicinity of a corner portion of the mounting pad.

6. A method of mounting a surface mounted device, comprising:
    disposing each of solder balls arranged on a surface mounted device on each of mounting pads on the printed circuit board according to claim 1 at the center; and
    solder-jointing the mounting pads and the surface mounted device.

7. A mounting structure for a surface mounted device, comprising:
- a printed circuit board including a plurality of mounting pads each having a concave via hole; and
- a surface mounted device including a plurality of solder balls arranged thereon, the plurality of solder balls corresponding respectively to the plurality of mounting pads, the surface mounted device being mounted on the printed circuit board via the solder balls,
- wherein the center of the concave via hole on each of the mounting pads is apart from the center of each of the mounting pads by at least the diameter of the concave via hole, and
- each of the concave via holes is filled with solder.

8. The mounting structure for a surface mounted device according to claim 7, wherein a surface shape of the mounting pad is selected from a group consisting of circular, elliptic, and rectangular shapes.

9. The mounting structure for a surface mounted device according to claim 8, wherein the surface shape of the mounting pad is circular, and the concave via hole is provided in the vicinity of the circumference of the mounting pad.

10. The mounting structure for a surface mounted device according to claim 8, wherein the surface shape of the mounting pad is elliptic, and the concave via hole is provided in the vicinity of an end of the major axis of the mounting pad.

11. The mounting structure for a surface mounted device according to claim 8, wherein the surface shape of the mounting pad is rectangular, and the concave via hole is provided in the vicinity of a corner portion of the mounting pad.

12. The mounting structure for a surface mounted device according to claim 7, wherein the surface mounted device is a ball grid array package.

* * * * *